(12) United States Patent
Chung et al.

(10) Patent No.: US 12,062,527 B2
(45) Date of Patent: Aug. 13, 2024

(54) BAFFLE UNIT AND SUBSTRATE PROCESSING APPARATUS

(71) Applicant: Tokyo Electron Limited, Tokyo (JP)

(72) Inventors: Jun Young Chung, Gyeonggi-do (KR); Ryo Sasaki, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 851 days.

(21) Appl. No.: 17/114,722

(22) Filed: Dec. 8, 2020

(65) Prior Publication Data

US 2021/0193443 A1 Jun. 24, 2021

(30) Foreign Application Priority Data

Dec. 19, 2019 (JP) .................................. 2019-229510

(51) Int. Cl.
*H01L 21/00* (2006.01)
*H01J 37/32* (2006.01)

(52) U.S. Cl.
CPC .. *H01J 37/32834* (2013.01); *H01J 37/32633* (2013.01); *H01J 37/32082* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 2004/0206309 A1* | 10/2004 | Bera | .................... | H01J 37/3266 118/728 |
| 2005/0098265 A1* | 5/2005 | Fink | .................... | H01J 37/32633 156/345.51 |
| 2006/0118045 A1* | 6/2006 | Fink | .................... | H01J 37/32623 118/723 R |
| 2009/0206055 A1* | 8/2009 | Sato | .................... | H01J 37/32449 204/298.31 |
| 2014/0051253 A1* | 2/2014 | Guha | ................ | H01J 37/32633 156/345.33 |

FOREIGN PATENT DOCUMENTS

| | | |
|---|---|---|
| JP | 2000-188281 | 7/2000 |
| JP | 2003-224077 | 8/2003 |
| JP | 2007-525825 | 9/2007 |
| JP | 2009-200184 | 9/2009 |
| WO | 2005/048322 | 5/2005 |
| WO | 2009/054696 | 4/2009 |

* cited by examiner

*Primary Examiner* — Sylvia Macarthur
*Assistant Examiner* — Michelle Crowell
(74) *Attorney, Agent, or Firm* — IPUSA, PLLC

(57) ABSTRACT

A baffle unit includes an inner ring, an outer ring disposed outside the inner ring, and a connecting portion connecting the inner ring with the outer ring. The connecting portion includes multiple openings arranged in a radial direction of the baffle unit and in a circumferential direction of the baffle unit, each of the multiple openings being arcuate and extending in the circumferential direction; multiple rigid portions each being disposed between the adjacent openings of the multiple openings that are adjacent to each other on a same concentric circle of the baffle unit; and multiple walls each being formed between the adjacent openings of the multiple openings that are adjacent to each other in the radial direction. Each of the multiple walls connects a rigid portion of the multiple rigid portions with another rigid portion of the multiple rigid portions.

12 Claims, 6 Drawing Sheets

BAFFLE UNIT AND SUBSTRATE PROCESSING APPARATUS

CROSS-REFERENCE TO RELATED APPLICATIONS

This patent application is based upon and claims priority to Japanese Patent Application No. 2015-229510 filed on Dec. 15, 2019, the entire contents of which are incorporated herein by reference.

TECHNICAL FIELD

The present disclosure relates to a baffle unit and a substrate processing apparatus.

BACKGROUND

In a substrate processing apparatus that applies desired processing, such as etching, to substrates, a baffle unit through which a gas flows is provided.

Patent Document 1 describes a baffle plate assembly including a baffle plate on which multiple slots are arrayed in the radial direction.

RELATED ART DOCUMENT

Patent Document

[Patent Document 1] Japanese National Publication of International Patent Application No. 2007-525825

SUMMARY

In one aspect, the present disclosure provides a baffle unit and a substrate processing apparatus that suppress damage to the baffle unit.

In order to solve the problem, according to one aspect, there is provided a baffle unit that includes an inner ring, an outer ring disposed outside the inner ring, and a connecting portion connecting the inner ring with the outer ring. The connecting portion includes multiple openings arranged in a radial direction of the baffle unit and in a circumferential direction of the baffle unit, each of the multiple openings being arcuate and extending in the circumferential direction; multiple rigid portions each being disposed between the adjacent openings of the multiple openings that are adjacent to each other on a same concentric circle of the baffle unit; and multiple walls each being formed between the adjacent openings of the multiple openings that are adjacent to each other in the radial direction. Each of the multiple walls connects a rigid portion of the multiple rigid portions with another rigid portion of the multiple rigid portions.

DETAILED DESCRIPTION OF EMBODIMENTS

In the following, embodiments for carrying out the present disclosure will be described with reference to the drawings. In each drawing, elements having identical features are given the same reference symbols and overlapping descriptions may be omitted.

Substrate Processing Apparatus

Figure 1:
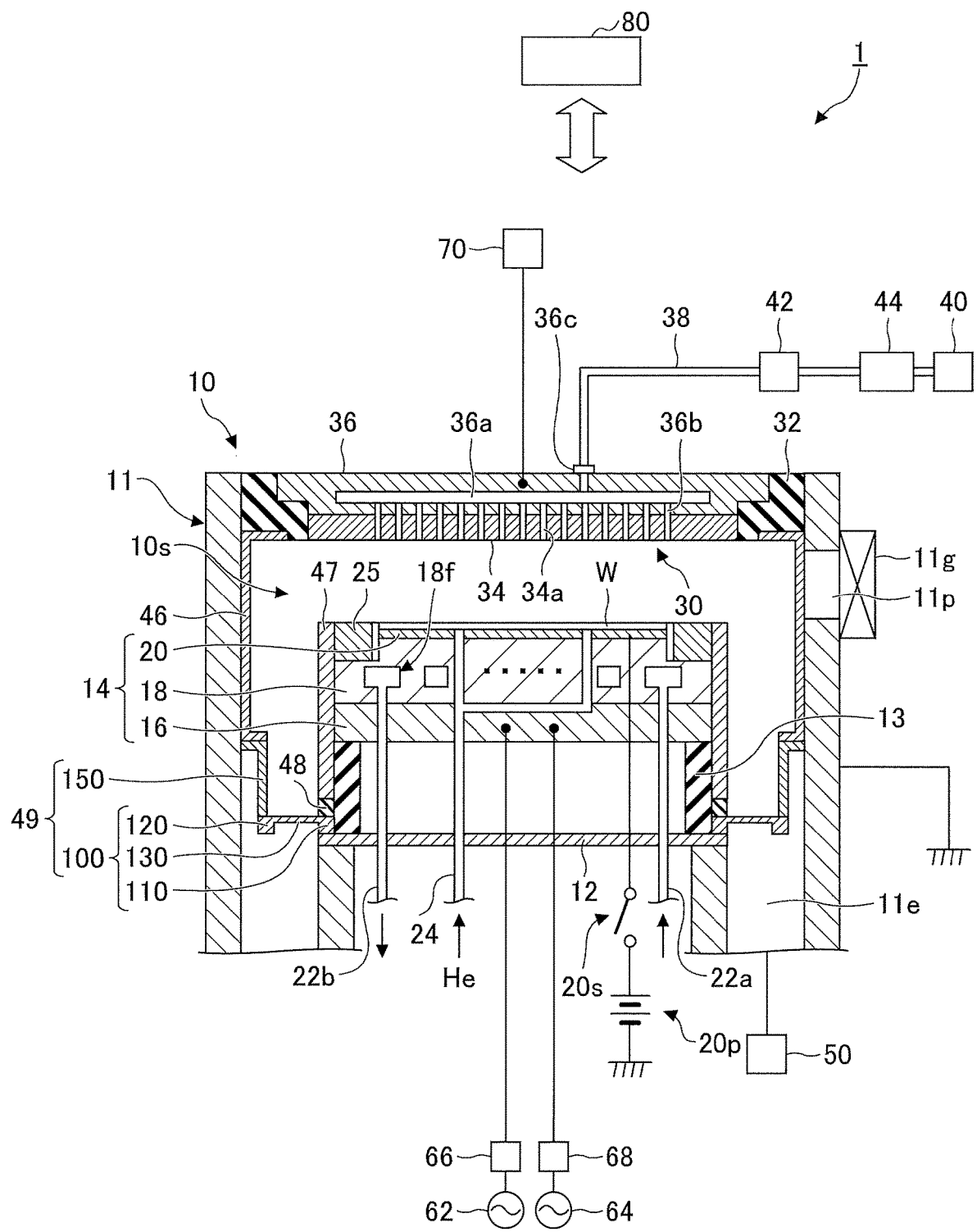
FIG. 1 is a cross-sectional view illustrating a schematic configuration of a substrate processing apparatus according to an embodiment.

A substrate processing apparatus 1 according to an embodiment will be described with reference to FIG. 1. FIG. 1 is a cross-sectional view illustrating an example of the substrate processing apparatus 1 according to the present embodiment.

The substrate processing apparatus 1 includes a chamber 10. The chamber 10 provides an interior space 10s therein. The chamber 10 includes a chamber body 11. The chamber body 11 has a generally cylindrical shape. The chamber body 11 is formed of, for example, aluminum. A corrosion resistant film is provided on the inner wall surface of the chamber body 11. The film may be formed of ceramic such as aluminum oxide or yttrium oxide.

A passage 11p is formed in the side wall of the chamber body 11. A substrate W is transferred between the interior space 10s and the exterior of the chamber 10 through the passage 11p. The passage 11p is opened and closed by a gate valve 11g provided along the side wall of the chamber body 11.

On the bottom of the chamber body 11, a support 13 is provided via a bottom plate 12 formed of aluminum or the like. The support 13 is formed of an insulating material. The support 13 is generally cylindrical in shape. The support 13 extends upward from the bottom of the chamber body 11 in the interior space 10s. At the upper portion of the support 13, a support platform 14 is disposed. The support platform 14 is configured to support the substrate W in the interior space 10s.

The support platform 14 includes a lower electrode 18 and an electrostatic chuck 20. The support platform 14 may further include an electrode plate 16. The electrode plate 16 is formed of a conductor such as aluminum, and is generally disc-shaped. The lower electrode 18 is disposed on the electrode plate 16. The lower electrode 18 is formed of a conductor such as aluminum, and is generally disc-shaped. The lower electrode 18 is electrically connected to the electrode plate 16.

The electrostatic chuck 20 is provided on the lower electrode 18. A substrate W is placed on the upper surface of the electrostatic chuck 20. The electrostatic chuck 20 has a body and an electrode. The body of the electrostatic chuck 20 is generally disc-shaped, and is formed of a dielectric material. The electrode of the electrostatic chuck 20 is a film-like electrode provided within the body of the electrostatic chuck 20. The electrode of the electrostatic chuck 20 is connected to a direct-current (DC) power supply 20p via a switch 20s. When voltage from the DC power supply 20p is applied to the electrode of the electrostatic chuck 20, electrostatic attracting force is generated between the electrostatic chuck 20 and the substrate W. By the electrostatic attractive force, the substrate W is held by the electrostatic chuck 20.

An edge ring 25 is disposed on a periphery of the lower electrode 18 to surround the edge of the substrate W. The edge ring 25 improves in-plane uniformity of plasma processing applied to the substrate W. The edge ring 25 may be formed of silicon, silicon carbide, quartz, or the like.

A flow passage 18f is provided within the lower electrode 18. A heat exchange medium (e.g., refrigerant) is supplied to the flow passage 18f from a chiller unit (not illustrated) provided outside the chamber 10 through a pipe 22a. The heat exchange medium supplied to the flow passage 18f is returned to the chiller unit via a pipe 22b. In the substrate processing apparatus 1, the temperature of the substrate W placed on the electrostatic chuck 20 is adjusted by heat exchange between the heat exchange medium and the lower electrode 18.

The substrate processing apparatus 1 is provided with a gas supply line 24. The gas supply line 24 supplies heat transfer gas (e.g., He gas) from a heat transfer gas supply mechanism to a gap between the upper surface of the electrostatic chuck 20 and the bottom surface of the substrate W.

The substrate processing apparatus 1 further includes an upper electrode 30. The upper electrode 30 is provided above the support platform 14. The upper electrode 30 is supported on the top of the chamber body 11 via a member 32. The member 32 is formed of an insulating material. The upper electrode 30 and the member 32 occlude the top opening of the chamber body 11.

The upper electrode 30 may include a top plate 34 and a support 36. The lower surface of the top plate 34 is exposed to the interior space 10s, and defines the interior space 10s. The top plate 34 may be formed of a low resistance conductor or semiconductor with low Joule heat generation. The top plate 34 has multiple gas discharge holes 34a penetrating the top plate 34 in a thickness direction of the top plate 34.

The support 36 removably supports the top plate 34. The support 36 is formed of an electrically conductive material such as aluminum. Inside the support 36, a gas diffusion chamber 36a is provided. The support 36 has multiple gas holes 36b extending downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 38 is connected to the gas inlet 36c.

Valves 42, flow controllers 44, and gas sources 40 are connected to the gas supply line 38. The gas sources 40, the valves 42, and the flow controllers 44 constitute a gas supply section. Each of the valves 42 may be an open/close valve. Each of the flow controllers 44 is a mass flow controller or a pressure-controlled flow controller. Each of the gas sources 40 is connected to the gas supply line 38 via a corresponding open/close valve of the valves 42 and a corresponding flow controller of the flow controllers 44.

In the substrate processing apparatus 1, a shield 46 is removably provided along the inner wall surface of the chamber body 11. The shield 46 prevents reaction by-products from adhering to the chamber body 11. Also, a shield 47 is removably provided along the outer periphery of the support 13 and support platform 14. The shield 47 prevents reaction by-products from adhering to the support 13 and support platform 14. The shields 46 and 47 are, for example, made of quartz ($SiO_2$). A cylindrical member 48 formed of an insulator having corrosion resistance is disposed below the shield 47.

A baffle unit 49 is provided between the outer side wall of the support 13 and the inner side wall of the chamber body 11. The baffle unit 49 includes a baffle plate 100 and a cylindrical member 150.

The baffle plate 100 is a disc-shaped member having a circular hole, into which the support 13 is inserted, in the center of the baffle plate 100. The baffle plate 100 has an inner ring 110, an outer ring 120 and a connecting portion 130. The inner ring 110 is an annular member provided around the outer periphery of the support 13. The inner ring 110 is disposed on the bottom plate 12 and below the shield 47. The outer ring 120 is an annular member provided around the outer circumferential side of the inner ring 110. The connecting portion 130 connects the inner ring 110 and the outer ring 120, and multiple openings (see FIG. 2, below) through which gas can flow are formed in the connecting portion 130. The baffle plate 100 is integrally formed from a material containing Si, such as Si or SiC, or a material containing aluminum.

The cylindrical member 150 is a generally cylindrical member extending in a height direction (i.e., axial direction, which is a vertical direction in FIG. 1). The upper portion of the cylindrical member 150 is connected to the shield 46. The lower portion of the cylindrical member 150 is connected to the outer ring 120 of the baffle plate 100. The cylindrical member 150 may be formed of a material containing Si, such as Si or SiC, or a material containing aluminum.

It is described that the configuration of the baffle unit 49 is such that the inner ring 110, the outer ring 120, and the connecting portion 130 are integrally formed as the baffle plate 100 and the cylindrical member 150 is formed separately from the baffle plate 100. However, the configuration of the baffle unit 49 is not limited thereto. The baffle plate 100 and the cylindrical member 150 may be integrally formed as a baffle unit 49. The baffle unit 49 may only consist of the plate-like baffle plate 100 without including the cylindrical member 150.

An exhaust port 11e is provided below the baffle unit 49 and at the bottom of the chamber body 11. An exhaust device 50 is connected to the exhaust port lie through an exhaust pipe (not illustrated). The exhaust device 50 includes a pressure regulating valve and a vacuum pump such as a turbomolecular pump.

The substrate processing apparatus 1 includes a first radio frequency power supply 62 and a second radio frequency power supply 64. The first radio frequency power supply 62 is a power source that generates first radio frequency power. The first radio frequency power has a frequency suitable for generating a plasma. The frequency of the first radio frequency power is, for example, a frequency in the range of 27 MHz to 100 MHz. The first radio frequency power supply 62 is connected to the lower electrode 18 via a matcher 66 and the electrode plate 16. The matcher 66 includes circuitry for causing the output impedance of the first radio frequency power supply 62 to match impedance of the load side (lower electrode 18 side). The first radio frequency power supply 62 may be connected to the upper electrode 30 via the matcher 66. The first radio frequency power supply 62 constitutes an exemplary plasma generator.

The second radio frequency power supply 64 is a power source that generates second radio frequency power. The second radio frequency power has a frequency lower than the frequency of the first radio frequency power. In a case in which the second radio frequency power is used in conjunction with the first radio frequency power, the second radio frequency power is used as radio frequency power for biasing to draw ions into the substrate W. The frequency of the second radio frequency power is, for example, a frequency in the range of 400 kHz to 13.56 MHz. The second radio frequency power supply 64 is connected to the lower electrode 18 via a matcher 68 and the electrode plate 16. The matcher 68 includes circuitry for causing the output impedance of the second radio frequency power supply 64 to match impedance of the load side (lower electrode 18 side).

It should be noted that a plasma may be generated using the second radio frequency power, without using a first radio frequency power. That is, a plasma may be generated using only single radio frequency power. In such a case, the frequency of the second radio frequency power may be greater than 13.56 MHz, for example 40 MHz. In this case, the substrate processing apparatus 1 may not include the first radio frequency power supply 62 and the matcher 66. The second radio frequency power supply 64 constitutes an exemplary plasma generator.

In the substrate processing apparatus 1, gas is supplied from the gas supply to the interior space 10s to produce a plasma. Also, as the first radio frequency power and/or the second radio frequency power are supplied, a radio frequency electric field is generated between the upper electrode 30 and the lower electrode 18. The generated radio frequency electric field generates a plasma.

The substrate processing apparatus 1 includes a power supply 70. The power supply 70 is connected to the upper electrode 30. The power supply 70 applies voltage to the upper electrode 30 to draw positive ions that are present in the interior space 10s into the top plate 34.

The substrate processing apparatus 1 may further include a controller 80. The controller 80 may be a computer including a processor, a storage device such as a memory, an input device, a display device, an input/output interface of a signal, or the like. The controller 80 controls each part of the substrate processing apparatus 1. An operator can perform input operations of commands to manage the substrate processing apparatus 1, by using the input device of the controller 80. The controller 80 can also display an operation status of the substrate processing apparatus 1 on the display device. Further, a control program and recipe data are stored in the storage device. The control program is executed by the processor to cause the substrate processing apparatus 1 to perform various processes. The processor executes the control program, and controls each part of the substrate processing apparatus 1 in accordance with the recipe data.

Figure 2:
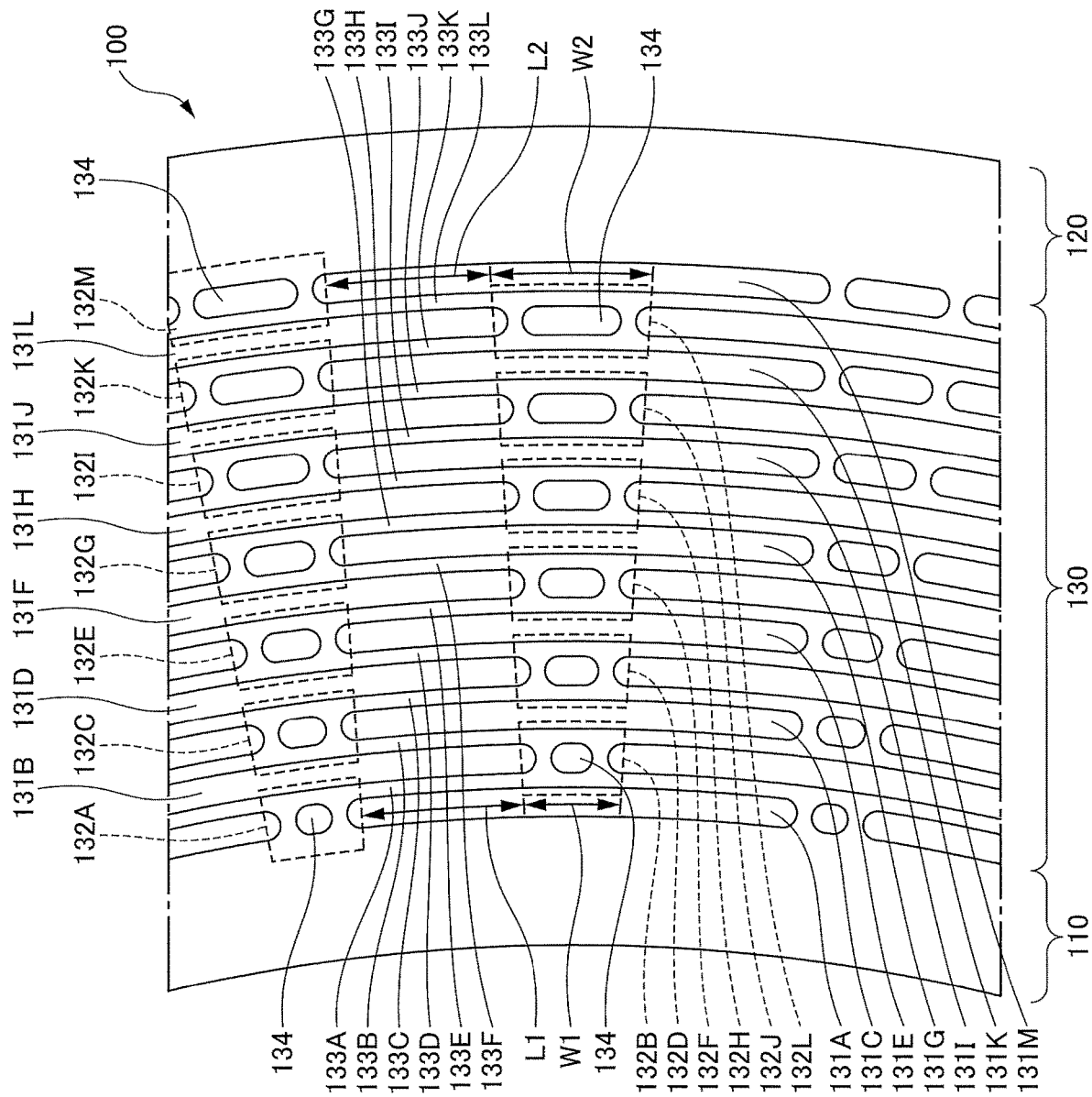
FIG. 2 is a partially enlarged plan view illustrating an example of a baffle plate according to the embodiment.

Next, the baffle plate 100 will be further described with reference to FIG. 2. FIG. 2 is a partially enlarged plan view illustrating an example of the baffle plate 100 according to the present embodiment.

The baffle plate 100 includes the annular inner ring 110, the annular outer ring 120 disposed outside the inner ring 110 in the radial direction, and the connecting portion 130 connecting the inner ring 110 and the outer ring 120. The inner ring 110 and the outer ring 120 are formed concentrically. Multiple arcuate openings 131A to 131M, each extending circumferentially, are formed in the connecting portion 130. The openings 131A to 131M are arranged in the radial direction and in the circumferential direction. Each of the openings 131A to 131M is formed into an arc-shaped slot hole in which the central axis of the slot is an arc.

On the baffle plate 100, the multiple (two or more) openings 131A to 131M are formed, when seen from the radial direction. Note that the respective openings (131A to 131M) arranged in the radial direction in FIG. 2 are denoted by 131A, 131B, . . . , 131M, from a side closer to the central axis of the baffle plate 100 toward the outer circumference of the baffle plate 100.

Further, on one concentric circle of the baffle plate (connecting portion 130), multiple (two or more) openings (131A, 131B, . . . , or 131M) are formed, seen from the circumferential direction. In the present embodiment, the same reference symbol is assigned to openings disposed on the same concentric circle of the baffle plate (connecting portion 130). That is, multiple (at least two or more) openings 131A are formed on a concentric circle of the connecting portion 130 that is concentric with the inner ring 110 and that is located closest to the inner ring 110. Similarly, the multiple openings 131B, the multiple openings 1310, . . . , and the multiple openings 131M are formed on other concentric circles concentric with the inner ring 110 respectively.

A rigid portion 132A is formed between adjacent openings 131A and 131A arranged on the same concentric circle. Similarly, between openings 131B to 131M and their respective adjacent openings 131B to 131M on the same concentric circles, rigid portions 132B to 132M are formed, respectively. Here, the rigid portions 132A to 132M are more rigid and less deformable than walls 133A to 133L to be described below.

Further, because the openings 131A to 131M are arranged in the baffle plate 100 in the radial direction, an arcuate wall 133A extending in the circumferential direction concentric with the inner ring 110 is formed between the openings 131A and 131B adjacent in the radial direction. Similarly, between the opening 131B and the opening 131C adjacent in the radial direction, between the opening 131C and the opening 131D adjacent in the radial direction, . . . , and between the opening 131L and the opening 131M adjacent in the radial direction, arcuate walls 133B to 133L, which extend in the circumferential direction concentric with the inner ring 110, are formed, respectively. Here, the walls 133A to 133L are less rigid and more deformable than the rigid portions 132A to 132M.

Figure 4:
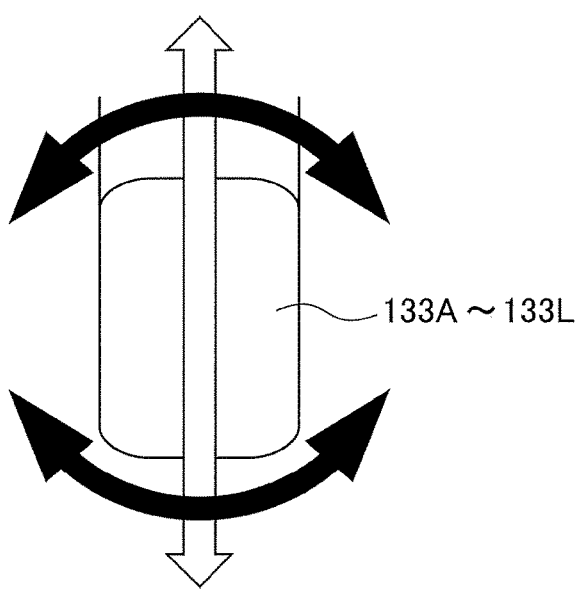
FIG. 4 is an example of a cross-sectional perspective view illustrating a cross-sectional shape of a wall section and direction of deformation of the wall.

The cross-sectional shape of the walls 133A to 133L, cut along a plane whose normal is the circumferential direction (a plane perpendicular to the extending directions of the walls 133A to 133L), is generally rectangular, as illustrated in FIG. 4 below. Specifically, the cross-sectional shape of each of the walls 133A to 133L is longer (greater) in the vertical direction (i.e., height direction, or thickness direction of the baffle plate 100) as compared to the lateral direction (i.e., radial direction, or a direction in which the walls 133A to 133L are arranged).

Further, the openings 131B formed in the circumferential direction are arranged such that each of the openings 131B is shifted by a certain amount in the circumferential direction of the baffle plate 100, with respect to an adjacent opening 131A of the openings 131A. Specifically, if the length of an arc between the centers of two adjacent openings 131A is referred to as a "pitch of the openings 131A", the opening 131A and the opening 131B adjacent to the opening 131A are mutually shifted by approximately half the pitch of the opening 131A in the circumferential direction of the baffle plate 100. Similarly, if the lengths of respective arcs between the centers of adjacent openings 131B, 131C, . . . , and 131M are referred to as "pitches of the openings 131B, 131C, . . . , and 131M", the openings 131C to 131M are positioned in the circumferential direction such that the openings 131C to 131M are each shifted by approximately half the pitches of the openings 131B to 131L in the circumferential direction of the baffle plate 100, relative to the openings 131B to 131L adjacent to the openings 131C to 131M respectively. Similarly, the rigid portions 132B formed in the circumferential direction are arranged such that each of the rigid portions 132B is shifted by half the pitch of the openings 131A in the circumferential direction of the baffle plate 100, relative to the adjacent rigid portion 132A. Similarly, the rigid portions 132C to 132M formed in the circumferential direction are arranged such that each of the respective rigid portions 132C to 132M are shifted by half the pitches of the openings 131B to 131L in the circumferential direction of the baffle plate 100, relative to the adjacent rigid portions 132B to 132L formed in the circumferential direction. In other words, lines on each of which the rigid portions 132A, 132C, 132E, 132G, 132I, 132K, and 132M are linearly arranged in the radial direction, and lines on each of which the rigid portions 132B, 132D, 132F, 132H, 132J, and 132L are linearly arranged in the radial direction, are formed on the connecting portion 130.

Because of the above-described structure, the arcuate wall 133A is formed so as to connect the rigid portion 132A with the rigid portion 132B. Similarly, the arcuate walls 133B to 133L are formed so as to connect the rigid portions 132B to 132L with the rigid portions 132C to 132M, respectively.

In addition, the walls 133A to 133L, which are easily deformable, are formed such that the circumferential length (i.e., arc length) of each of the walls 133A to 133L is equal to each other. For example, as illustrated in FIG. 2, let the circumferential length of the wall 133A be "L1", and let the circumferential length of the wall 133L be "L2". In this case, a relationship of "L1=L2" is established.

In other words, the region bounded by a line, on which the rigid portions 132A, 132C, 132E, 132G, 132I, 132K, and 132M in odd numbers counted from the radially inner side are aligned, and by a line on which the rigid portions 132B, 132D, 132F, 132H, 132J, 132L, and 132M in even numbers counted from the radially inner side are aligned, is a deformable region in which the walls 133A to 133L, which are easily deformed, are disposed. The deformable region has a rectangular shape, in a plan view of the baffle plate 100.

Furthermore, the rigid portions 132A to 132M, which are not deformed easily, are formed such that the circumferential widths (i.e., arc lengths) of the rigid portions 132A to 132M increase toward the outside. For example, as illustrated in FIG. 2, let the circumferential width of the rigid portion 132B be "W1" and let the circumferential width of the rigid portion 132L be "W2". In this case, a relationship of "W1<W2" is established. In other words, the circumferential widths of the rigid portions 132A to 132M are adjusted such that the circumferential length of each of the walls 133A to 133L is equal.

Note that a hole 134 may be formed in each of the rigid portions 132A to 132M. Further, the hole 134 may be formed in the shape of an arc-shaped slot hole. By forming the holes 134 in the rigid portions 132A to 132M, an aperture ratio of the baffle plate 100, which is a ratio of an opened portion in the baffle plate 100, is increased, and pressure loss can be reduced.

As illustrated in FIG. 1, the inner ring 110 of the baffle plate 100 is secured to the bottom plate 12 provided at the center of the bottom of the chamber 10. In contrast, the outer ring 120 of the baffle plate 100 is secured to the shield 46 that is disposed on the upper portion of the side wall of the chamber 10 via the cylindrical member 150. Accordingly, difference in a height direction (i.e., vertical direction) may occur between the inner ring 110 and the outer ring 120 of the baffle plate 100, due to a stacking tolerance of the chamber 10, thermal expansion, or the like.

Figure 3:
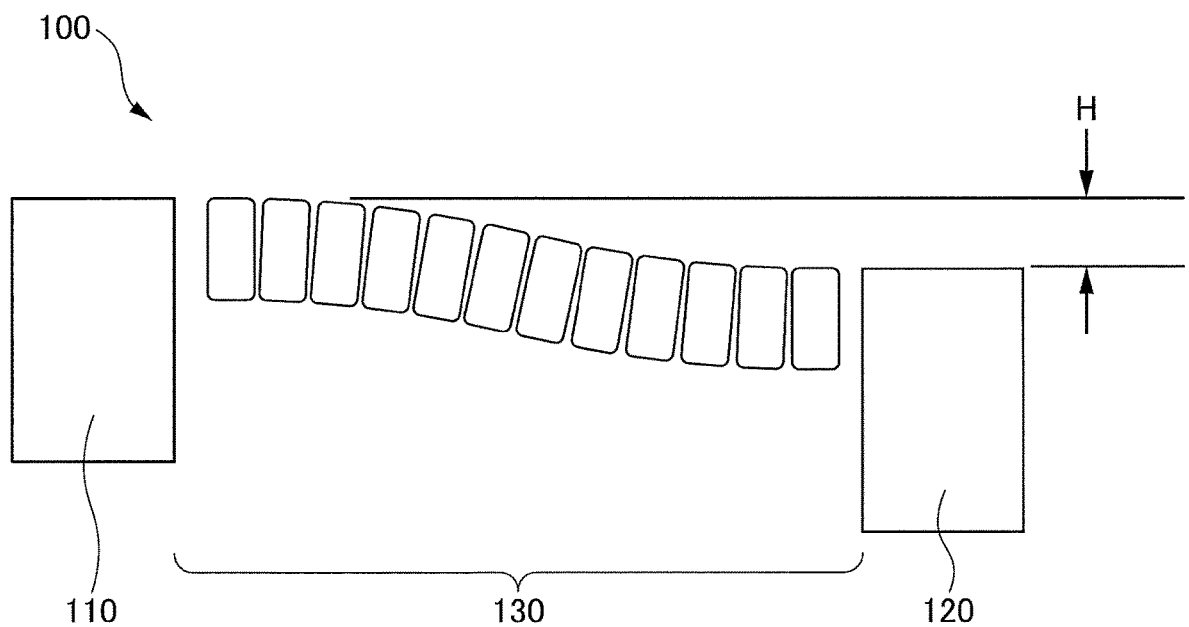
FIG. 3 is a diagram schematically illustrating deformation of the baffle plate according to the embodiment, in which an inner ring and an outer ring are shifted in the height direction.

FIG. 3 schematically illustrates deformation of the baffle plate 100 according to the present embodiment, when the inner ring 110 and the outer ring 120 are mutually shifted in the vertical direction. FIG. 4 is an example of a cross-sectional view illustrating a cross-sectional shape and directions of deformation of the walls 133A to 133L.

When the inner ring 110 and the outer ring 120 are mutually shifted by the difference H in the vertical direction, the walls 133A to 133L receive a torsional deformation force (indicated by black-coated arrows in FIG. 4) rather than a deformation force in the height direction (indicated by an outline arrow in FIG. 4). The difference H in the vertical direction between the inner ring 110 and the outer ring 120 is absorbed, as each of the walls 133A to 133L is torsionally deformed to a small degree. Further, by making the circumferential length of each of the walls 133A to 133L equal, concentration of deformation when the walls 133A to 133L are deformed can be suppressed. Accordingly, even if the inner ring 110 and the outer ring 120 are mutually shifted by the difference H in the vertical direction, damage of the baffle plate 100 can be prevented.

Here, the baffle plate 100 according to the present embodiment will be described by comparing with baffle plates 200 and 300 according to reference examples.

Figure 5:
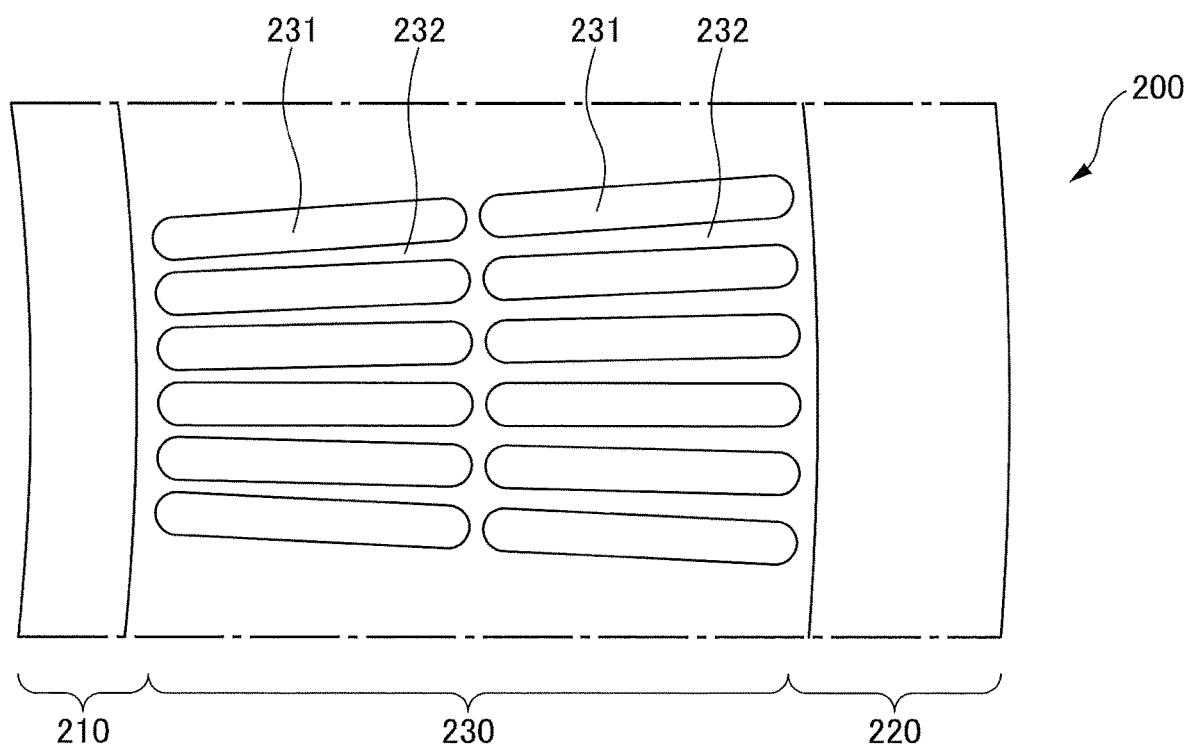
FIG. 5 is a partially enlarged plan view illustrating an example of a baffle plate according to a first reference example.

FIG. 5 is a partially enlarged plan view illustrating an example of the baffle plate 200 according to a first reference example. The baffle plate 200 according to the first reference example has an inner ring 210, an outer ring 220, and a connecting portion 230. In the connecting portion 230, openings (slot hole) 231 each extending in the radial direction are formed. Thus, in the baffle plate 200, walls 232 each extending in the radial direction are formed. In such a configuration, if the inner ring 210 and the outer ring 220 of the baffle plate 200 are mutually shifted by a difference H in the vertical direction, both ends of each of the walls 232 are mutually shifted by approximately H/2 in the vertical direction, and a deformation amount in the vertical direction per wall 232 is greater than that in the baffle plate 100 according to the present embodiment. Also, the direction of deformation of the wall 232 is a vertical direction of a rectangle of the cross-section of the wall 232 (i.e., direction indicated by the outline arrow in FIG. 4). Therefore, the baffle plate 200 according to the first reference example may be damaged because of occurrence of height difference between the inner ring 210 and the outer ring 220.

Figure 6:
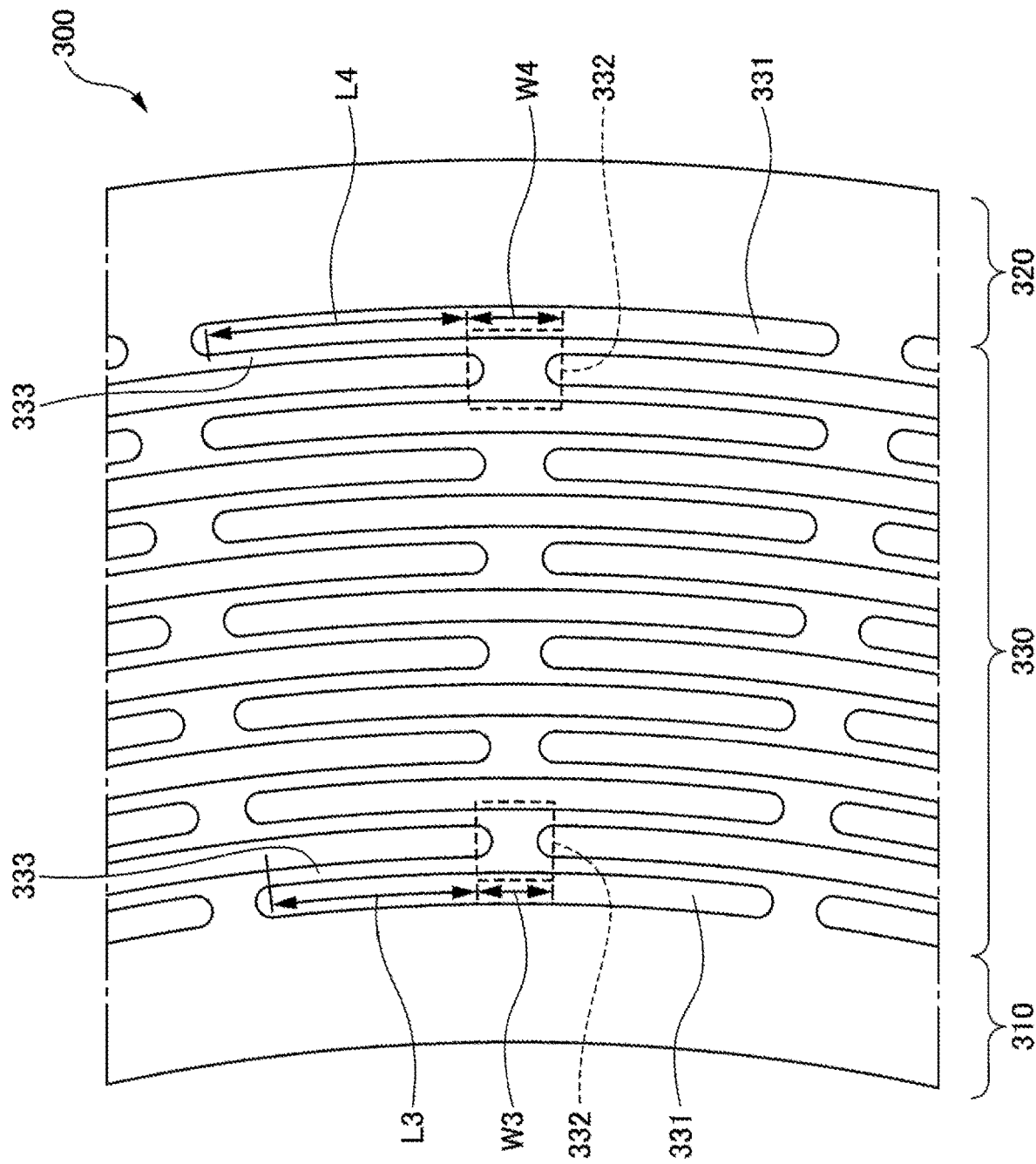
FIG. 6 is a partially enlarged plan view illustrating an example of a baffle plate according to a second reference example.

FIG. 6 is a partially enlarged plan view illustrating an example of the baffle plate 300 according to a second reference example. The baffle plate 300 according to the second reference example has an inner ring 310, an outer ring 320, and a connecting portion 330. In the connecting portion 330, openings 331 each extending in the circumferential direction are formed. A rigid portion 332 is formed between the adjacent openings 331. Walls 333 are formed such that each of the walls 333 connects the rigid portions 332 disposed at its both ends. Here, in the baffle plate 300 of the second reference example, the circumferential length (width) of each of the rigid portions 332 is substantially the same. For example, the circumferential width W3 of the rigid portion 332 at the inner ring side and the circumferential width W4 of the rigid portion 332 at the outer ring side are substantially the same. In other words, in the baffle plate 300 of the second reference example, the circumferential length of the wall 333 of an arcuate shape increases toward the outside of the baffle plate 300. For example, the circumferential length L3 of the wall 333 at inner ring side is shorter than the circumferential length L4 of the wall 333 at the outer ring side.

Figure 7:
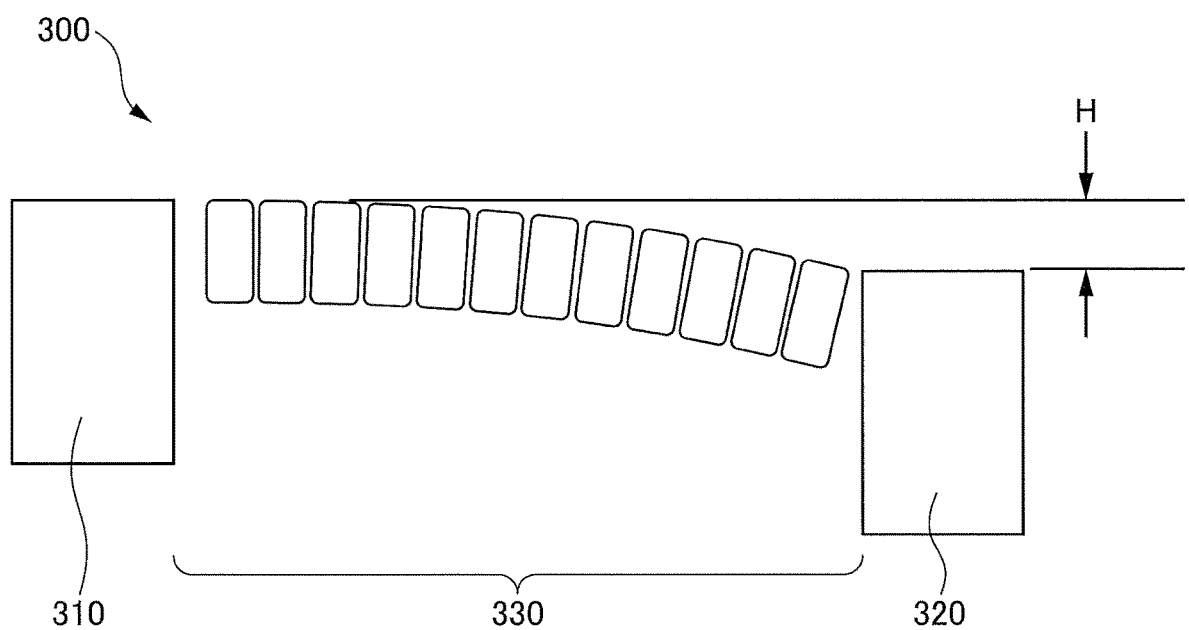
FIG. 7 is a diagram schematically illustrating deformation of the baffle plate according to the second reference example, in which an inner ring and an outer ring are shifted in the height direction.

FIG. 7 is a diagram schematically illustrating deformation of the baffle plate 300 according to the second reference example when the inner ring 310 and the outer ring 320 are mutually shifted in the vertical direction. As illustrated in FIG. 6, because the circumferential length of the wall 333 located at the inner side of the baffle plate 300 differs from that located at the outer side of the baffle plate 300, the wall 333 located at the outer side is more deformable than the wall 333 located at the inner side. Therefore, if the inner and outer rings 310 and 320 are mutually shifted by a difference H in the vertical direction, the amount of deformation in the wall 333 located at the outer side becomes significantly large. Therefore, the baffle plate 300 according to the second reference example may be damaged due to occurrence of height difference between the inner ring 310 and the outer ring 320.

In contrast, as the baffle unit 49 (the baffle plate 100) according to the present embodiment can suppress concentration of deformation, even if a height difference (i.e., difference in the vertical direction) H occurs between the inner ring 110 and the outer ring 120, damage of the baffle plate 100 can be prevented.

Further, in the baffle unit 49 (the baffle plate 100) according to the present embodiment, because deformation of each of the walls 133A to 133L can be reduced, even if a material containing Si, such as Si or SiC, having higher stiffness than a metallic material (for example, aluminum) is used as a material of the baffle unit 49, the difference H in the vertical direction between the inner ring 110 and the outer ring 120 can be absorbed, thereby preventing damage to the baffle plate 100. Accordingly, the substrate processing apparatus 1 according to the present embodiment can use a material containing Si, such as Si, SiC, or $SiO_2$, as a material for the shields 46 and 47 and the baffle unit 49. If an aluminum material having a protective film (for example, $Y_2O_3$) formed on the surface is used as a material of the shields 46 and 47 and the baffle unit 49, during plasma processing of a substrate W, an element (Y) derived from the protective film is generated by the plasma, and the element (Y) derived from the protective film may affect the processing of the substrate W. In contrast, if a material containing Si, such as Si, SiC, or $SiO_2$, is used as a material of the shields 46 and 47 and the baffle unit 49, influence on the processing of the substrate W can be reduced.

Also, in the baffle unit 49 (baffle plate 100) according to the present embodiment, both the inner and outer ends of the baffle unit 49 can be secured. This facilitates ensuring electrical conductivity between the baffle unit 49 and the bottom plate 12.

Also, in the baffle unit 49 (baffle plate 100) according to the present embodiment, it is preferable that a shape of the cross-section of each of the walls 133A to 133L that is cut along a plane whose normal is the circumferential direction (a plane perpendicular to the extending directions of the walls 133A to 133L) is rectangular. This makes it easier to deform the walls 133A to 133L in a torsional direction. In addition, it is preferable that the aspect ratio of the cross-section of each of the walls 133A to 133L that is cut along a plane whose normal is the circumferential direction (a plane perpendicular to the extending directions of the walls 133A to 133L), which is a ratio of the height (length in the vertical direction) of the cross section to the width (length in the horizontal direction) of the cross section, is equal to or greater than 1. Thus, because the radial width of the opening 131 can be increased to increase the aperture ratio of the baffle plate 100, pressure loss can be reduced.

Although the embodiment and the like of the substrate processing apparatus 1 have been described, the present disclosure is not limited to the above-described embodiment and the like. Various modifications and enhancements can be made within the scope of the gist of the present disclosure as claimed.

What is claimed is:

1. A baffle unit comprising:
an inner ring;
an outer ring disposed outside the inner ring;
a connecting portion connecting the inner ring with the outer ring, the connecting portion including
a plurality of openings arranged in a radial direction of the baffle unit and in a circumferential direction of the baffle unit, each of the plurality of openings being arcuate and extending in the circumferential direction;
a plurality of rigid portions each being disposed between adjacent openings of the plurality of openings that are adjacent to each other on a same concentric circle of the baffle unit; and
a plurality of walls each being formed between the adjacent openings of the plurality of openings that are adjacent to each other in the radial direction, each of the plurality of walls connecting a rigid portion of the plurality of rigid portions with another rigid portion of the plurality of rigid portions,
wherein a width of each of the rigid portions in the circumferential direction increases toward an outside of the baffle unit, and
wherein a circumferential length of a first wall among the plurality of walls is equal to a circumferential length of a second wall among the plurality of walls, the first wall being adjacent to the second wall in the radial direction.

2. The baffle unit according to claim 1, wherein a width of each of the walls in the circumferential direction is equal.

3. The baffle unit according to claim 1, wherein an opening of the plurality of openings on a first concentric circle of the baffle unit and another opening of the plurality of openings on a second concentric circle of the baffle unit adjacent to the first concentric circle are mutually shifted, in the circumferential direction, by half a pitch of the opening on the first concentric circle, the pitch being a length of an arc between centers of adjacent openings of the plurality of openings on the first concentric circle.

4. The baffle unit according to claim 1, wherein, in a case in which the inner ring and the outer ring are shifted in a vertical direction, the walls are deformed in a torsional direction.

5. The baffle unit according to claim 1, wherein each of the rigid portions includes a hole.

6. The baffle unit according to claim 1, wherein a cross-sectional shape of each of the walls is rectangular.

7. The baffle unit according to claim 6, wherein an aspect ratio of a cross section of each of the walls is equal to or greater than 1.

8. The baffle unit according to claim 1, wherein the inner ring, the outer ring, and the connecting portion are integrally formed.

9. The baffle unit according to claim 1, wherein the inner ring, the outer ring, and the connecting portion are formed of Si or SiC.

10. A substrate processing apparatus comprising the baffle unit according to claim 1.

11. A baffle unit comprising:
an inner ring;
an outer ring disposed outside the inner ring;
a connecting portion connecting the inner ring with the outer ring, the connecting portion including
  a plurality of openings arranged in a radial direction of the baffle unit and in a circumferential direction of the baffle unit, each of the plurality of openings being arcuate and extending in the circumferential direction;
  a plurality of rigid portions each being disposed between adjacent openings of the plurality of openings that are adjacent to each other on a same concentric circle of the baffle unit; and
  a plurality of walls each being formed between the adjacent openings of the plurality of openings that are adjacent to each other in the radial direction, each of the plurality of walls connecting a rigid portion of the plurality of rigid portions with another rigid portion of the plurality of rigid portions; wherein
a width of each of the rigid portions in the circumferential direction increases toward an outside of the baffle unit;
a width of each of the walls in the circumferential direction is equal;
an opening of the plurality of openings on a first concentric circle of the baffle unit and another opening of the plurality of openings on a second concentric circle of the baffle unit adjacent to the first concentric circle are mutually shifted, in the circumferential direction, by half a pitch of the opening on the first concentric circle, the pitch being a length of an arc between centers of adjacent openings of the plurality of openings on the first concentric circle;
in a case in which the inner ring and the outer ring are shifted in a vertical direction, the walls are deformed in a torsional direction;
each of the rigid portions includes a hole;
a shape of a cross section of each of the walls is rectangular;
an aspect ratio of the cross section of each of the walls is equal to or greater than 1; and
the inner ring, the outer ring, and the connecting portion are formed of Si or SiC, and are integrally formed,
wherein a width of each of the rigid portions in the circumferential direction increases toward an outside of the baffle unit, and
wherein a circumferential length of a first wall among the plurality of walls is equal to a circumferential length of a second wall among the plurality of walls, the first wall being adjacent to the second wall in the radial direction.

12. A substrate processing apparatus comprising the baffle unit according to claim 11.

* * * * *